(12) United States Patent
Shin et al.

(10) Patent No.: US 12,230,735 B2
(45) Date of Patent: Feb. 18, 2025

(54) DISPLAY DEVICE INCLUDING Ga DOPED INDIUM TIN OXIDE (ITO) BASED EMISSION LAYER AND MANUFACTURING METHOD THEREOF

(71) Applicant: Samsung Display Co., Ltd., Yongin-Si (KR)

(72) Inventors: Hyun Eok Shin, Gwacheon-si (KR); Ju Hyun Lee, Seongnam-si (KR); Sung Joo Kwon, Goyang-si (KR); Hyun Ah Sung, Suwon-si (KR); Dong Min Lee, Anyang-si (KR)

(73) Assignee: Samsung Display Co., Ltd., Yongin-si (KR)

(*) Notice: Subject to any disclaimer, the term of this patent is extended or adjusted under 35 U.S.C. 154(b) by 377 days.

(21) Appl. No.: 17/720,063

(22) Filed: Apr. 13, 2022

(65) Prior Publication Data

US 2023/0024131 A1    Jan. 26, 2023

(30) Foreign Application Priority Data

Jul. 26, 2021 (KR) .................. 10-2021-0097737

(51) Int. Cl.
*H01L 33/16* (2010.01)
*H01L 33/00* (2010.01)
*H01L 33/62* (2010.01)

(52) U.S. Cl.
CPC ............ *H01L 33/16* (2013.01); *H01L 33/005* (2013.01); *H01L 33/62* (2013.01)

(58) Field of Classification Search
CPC ....... H01L 33/16; H01L 33/005; H01L 33/62; H10K 59/80518; H10K 59/35
See application file for complete search history.

(56) References Cited

U.S. PATENT DOCUMENTS

| | | | |
|---|---|---|---|
| 8,420,423 B2 | 4/2013 | Choi et al. | |
| 2009/0243466 A1* | 10/2009 | Yokoyama | H10K 50/11 313/502 |
| 2010/0176412 A1* | 7/2010 | Yokoyama | H10K 50/125 257/40 |

FOREIGN PATENT DOCUMENTS

| | | |
|---|---|---|
| KR | 10-0628150 B1 | 9/2006 |
| KR | 10-2011-0109048 A | 10/2011 |
| KR | 10-1084177 B1 | 11/2011 |
| KR | 10-1458908 B1 | 11/2014 |
| KR | 10-1764743 B1 | 8/2017 |

* cited by examiner

*Primary Examiner* — Changhyun Yi
(74) *Attorney, Agent, or Firm* — Innovation Counsel LLP

(57) ABSTRACT

Provided is a display device comprising a substrate; a plurality of transistors disposed on the substrate; a first pixel electrode, a second pixel electrode, and a third pixel electrode respectively connected to the transistors; a first emission layer disposed to overlap the first pixel electrode, a second emission layer disposed to overlap the second pixel electrode, and a third emission layer disposed to overlap the third pixel electrode; and a common electrode disposed on the first emission layer, the second emission layer, and the third emission layer, wherein the first pixel electrode includes a first layer, and a second layer disposed on the first layer and including a Ga-doped ITO.

20 Claims, 18 Drawing Sheets

DISPLAY DEVICE INCLUDING Ga DOPED INDIUM TIN OXIDE (ITO) BASED EMISSION LAYER AND MANUFACTURING METHOD THEREOF

CROSS-REFERENCE TO RELATED APPLICATION

This application claims priority to and the benefit of Korean Patent Application No. 10-2021-0097737 filed in the Korean Intellectual Property Office on Jul. 26, 2021, the entire contents of which are incorporated herein by reference.

BACKGROUND

(a) Technical Field

The present disclosure generally relates to a display device and a manufacturing method thereof, and more particularly relates to a display device for changing a thickness of an anode of a light-emitting device and a manufacturing method thereof.

(b) Description of the Related Art

In general, a light emitting device (LED) is a self-emissive display for electrically exciting a fluorescent organic compound and emitting light, and it is receiving attention as a next-generation display for solving the defects that are pointed out as drawbacks of liquid crystal devices and allowing driving performance with a low voltage, becoming thinner, and providing a wide viewing angle and a fast response.

The light emitting device has a structure in which an emission layer in a functional thin film form is inserted between an anode and a cathode, and it is an element in which holes are injected at the anode and electrons are injected at the cathode, the electrons and the holes are combined in the emission layer to form excitons, and the excitons are recombined to emit light.

When the light emitting device is manufactured, a reflection film is formed at a bottom of the anode electrically connected to a source or a drain of a TFT circuit to increase extraction of light. However, a color with an accurate spectrum is not displayed because of a micro cavity effect among the reflection film, the anode, and the cathode, a wavelength may be split, or luminance and color coordinates may be changed according to the colors.

To supplement the drawback caused by the micro cavity, a buffer layer is formed on an organic layer between the anode and the cathode to adjust a distance between the anode and the cathode or change the thickness of the electrode, thereby forming an appropriate cavity structure, and in this instance, to form buffer layers with different thicknesses for R, G, and B, a deposition mask must be added, and a loss of an organic material increases.

The above information disclosed in this Background section is only for enhancement of understanding of the background of the disclosure, and therefore it may contain information that does not form the prior art that is already known in this country to a person of ordinary skill in the art.

SUMMARY

The present disclosure has been made in an effort to provide a display device for improving displaying quality by differently forming a thickness of an anode of a light-emitting device, and a manufacturing method thereof.

An embodiment of the present disclosure provides a display device including: a substrate; a plurality of transistors disposed on the substrate; a first pixel electrode, a second pixel electrode, and a third pixel electrode respectively connected to the transistors; a first emission layer disposed to overlap the first pixel electrode, a second emission layer disposed to overlap the second pixel electrode, and a third emission layer disposed to overlap the third pixel electrode; and a common electrode disposed on the first emission layer, the second emission layer, and the third emission layer, wherein the first pixel electrode includes a first layer and a second layer disposed on the first layer and including a Ga-doped ITO.

A content of Ga of the second layer may be 1 at % to 10 at %.

A thickness of the second layer may be 300 Å to 1000 Å.

The second layer may be amorphous.

The first layer of the first pixel electrode, the second pixel electrode, and the third pixel electrode may include a same material.

A thickness of the first pixel electrode including the first layer and second layers may be greater than thicknesses of the second pixel electrode and the third pixel electrode, and the first layer of the first pixel electrode, the second pixel electrode, and the third pixel electrode may have a same thickness.

The first layer may be a sequential stack of layers of ITO/Ag/ITO.

An upper side of the ITO of the first layer may be crystalline.

The second pixel electrode may include a first layer, and a second layer disposed on the first layer and including a Ga-doped ITO.

A content of Ga in the second layer of the second pixel electrode may be 1 at % to 10 at %.

A thickness of the second layer of the second pixel electrode may be 300 Å to 1000 Å.

The third pixel electrode may include a first layer, and a second layer disposed on the first layer and including a Ga-doped ITO.

A content of Ga in the second layer of the third pixel electrode may be 1 at % to 10 at %.

A thickness of the second layer of the third pixel electrode may be 300 Å to 1000 Å.

The first emission layer may emit green light, the second emission layer may emit blue light, and the third emission layer may emit red light.

Another embodiment of the present disclosure provides a method for manufacturing a display device including: providing a substrate; forming a first conductive layer on the substrate and patterning the same to form a first layer of a first pixel electrode, a second pixel electrode, and a third pixel electrode; heat-treating the patterned first conductive layer to crystallize the same; forming a second conductive layer on the first conductive layer; and patterning the second conductive layer to form a second layer disposed on the first layer of the first pixel electrode, wherein the second conductive layer includes a Ga-doped ITO.

A content of Ga of the second layer of the first pixel electrode may be 1 at % to 10 at %.

A thickness of the second layer of the first pixel electrode may be 300 Å to 1000 Å.

The second conductive layer may be amorphous.

The first conductive layer may be a sequential stack of layers of ITO/Ag/ITO.

According to the embodiments, the display device for improving displaying quality, and the manufacturing method thereof, are provided.

DETAILED DESCRIPTION OF THE EMBODIMENTS

Figure 1:
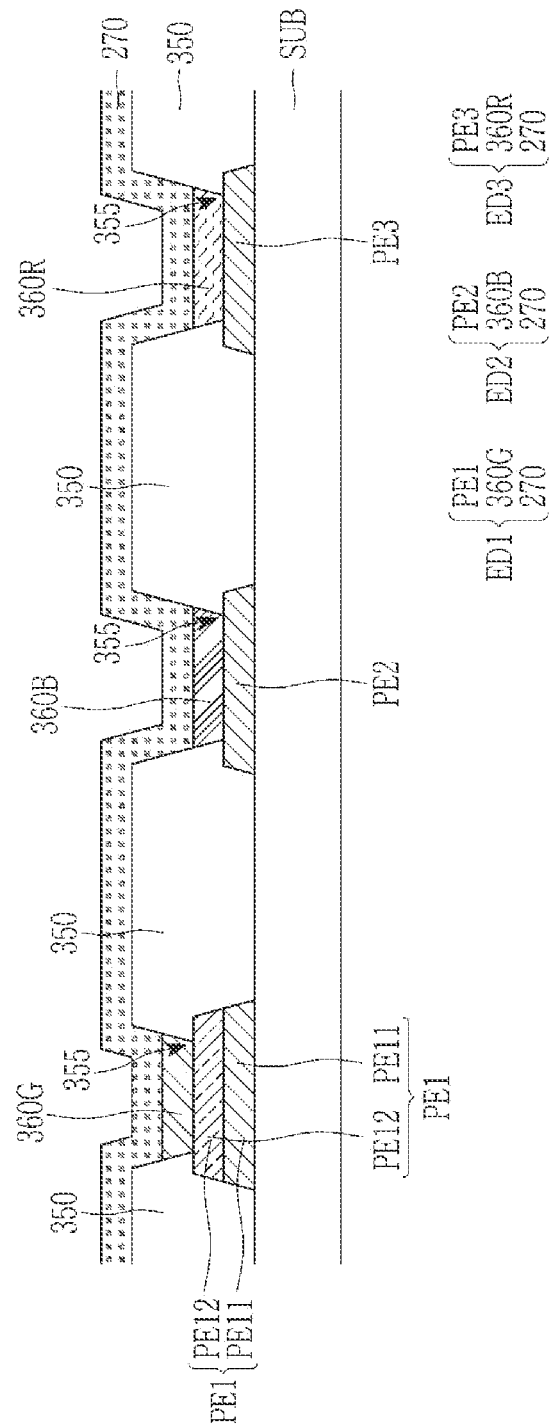
FIG. 1 shows a display device according to the present embodiment with a focus on a light-emitting device.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Parts that are irrelevant to the description will be omitted to clearly describe the present disclosure, and the same elements will be designated by the same reference numerals throughout the specification.

The size and thickness of each configuration shown in the drawings are arbitrarily shown for better understanding and ease of description, but the present disclosure is not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A display device according to an embodiment of the present disclosure will now be described in detail. FIG. 1 shows a display device including a plurality of light-emitting devices. Referring to FIG. 1, a first light-emitting device (ED1), a second light-emitting device (ED2), and a third light-emitting device (ED3) may be positioned on a substrate (SUB). Although not shown in FIG. 1, each of the light-emitting devices may be connected to a transistor and may display different colors. For example, the first light-emitting device (ED1) may be a green light-emitting device, the second light-emitting device (ED2) may be a blue light-emitting device, and the third light-emitting device (ED3) may be a red light-emitting device.

Referring to FIG. 1, a first pixel electrode (PE1), a second pixel electrode (PE2), and a third pixel electrode (PE3) are positioned on the substrate (SUB). As shown in FIG. 1, the first pixel electrode (PE1) may include a first layer (PE11) and a second layer (PE12).

The first layer (PE11) of the first pixel electrode (PE1), the second pixel electrode (PE2), and the third pixel electrode (PE3) may include the same material. They may have the same thickness. That is, the first layer (PE11) of the first pixel electrode (PE1), the second pixel electrode (PE2), and the third pixel electrode (PE3) may be made by the same process and may include the same material.

For example, the first layer (PE11) of the first pixel electrode (PE1), the second pixel electrode (PE2), and the third pixel electrode (PE3) may include ITO/Ag/ITO. A thickness of the ITO may be 60 to 120 Å, and a thickness of the Ag may be 500 Å to 1000 Å. When the thickness of the ITO is greater than 120 Å, the ITO is crystallized and is difficult to etch, and etching residues may remain in an etching process for forming an electrode.

Referring to FIG. 1, the first pixel electrode (PE1) may include a second layer (PE12) positioned on the first layer (PE11).

The second layer (PE12) may include a Ga doped ITO (Ga-ITO). A content of Ga in the Ga doped ITO may be 1 at % to 10 at %. The thickness of the second layer (PE12) may be 300 Å to 1000 Å. The second layer (PE12) may be amorphous.

As the second layer (PE12) includes the Ga doped ITO and is amorphous, the thickness of the second layer (PE12) may increase without the problem of crystallization and etching residues. Hence, the thickness of the second layer (PE12) may be appropriately adjusted in the light-emitting device, if needed.

That is, when the thickness of the ITO increases, a surface of the first layer (PE11) including the ITO/Ag/ITO is crystallized, so it is difficult to etch the same, and the etching residues may remain. Therefore, it is not easy to increase the thickness of the electrode layer including an ITO.

Figure 2:
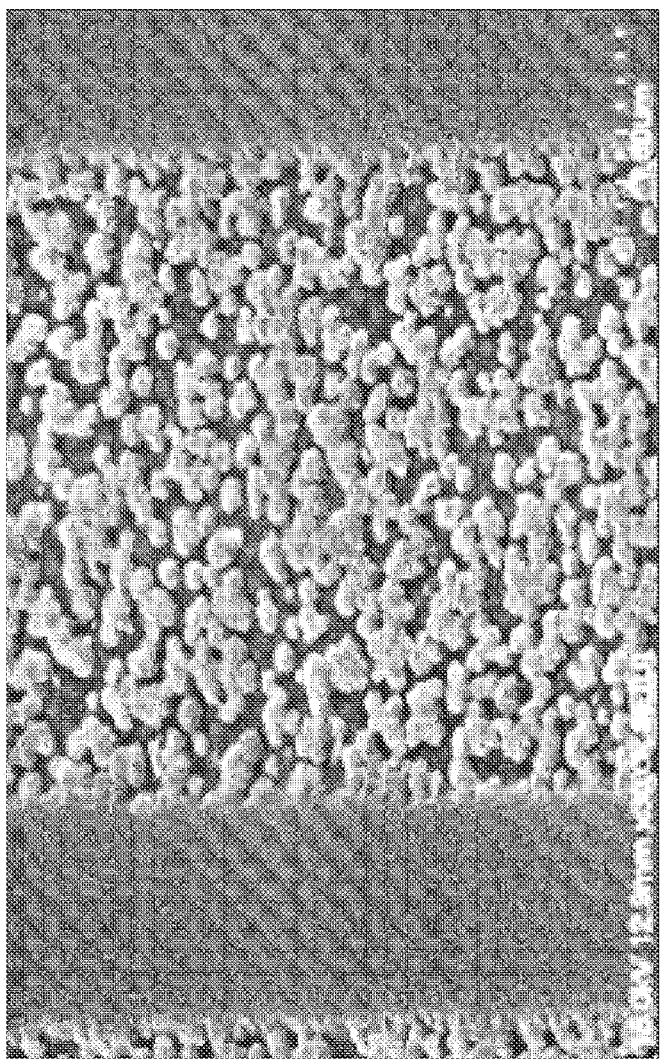
FIG. 2 shows an image in which, when an ITO is etched, its surface is crystallized and etching residues remain.

FIG. 2 shows an image in which, when an ITO is etched, its surface is crystallized and etching residues remain. As shown in FIG. 2, when the ITO becomes thicker than a predetermined value and is etched, the ITO is crystallized and is not properly etched.

Figure 3:
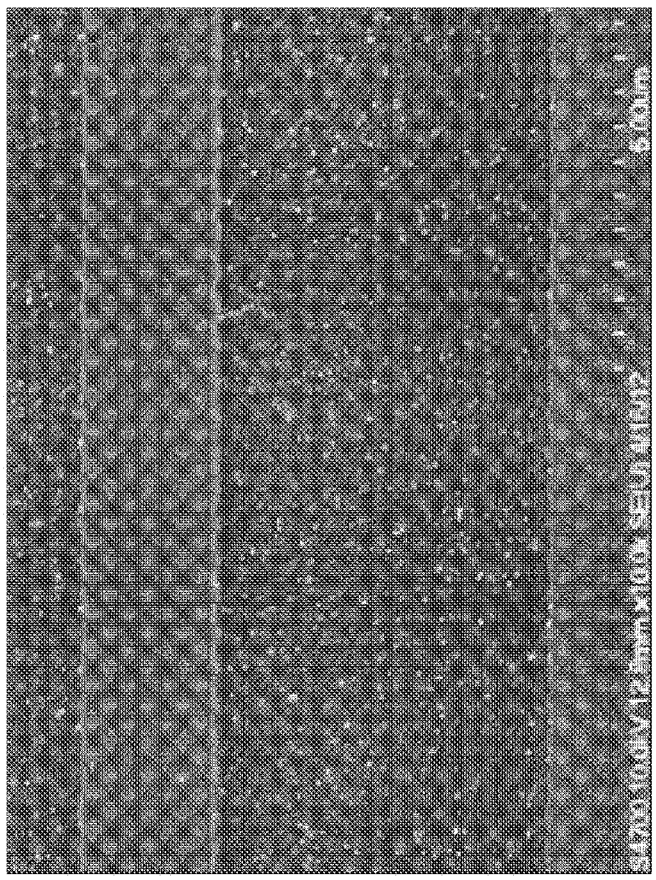
FIG. 3 shows a surface when a Ga-doped ITO is etched.

FIG. 3 shows a surface when a Ga-doped ITO is etched. When FIG. 2 is compared to the FIG. 3, it is found that the Ga-doped ITO is well etched as no residues are left.

The display device according to the present embodiment forms a multi-layered structure of the first pixel electrode (PE1). In detail, the first pixel electrode (PE1) may be formed to be relatively thick by configuring the first pixel electrode (PE1) with the first layer (PE11) including the ITO/Ag/ITO and the amorphous second layer (PE12) including the Ga-doped ITO.

Color purity of emitting light may be increased by easily adjusting an optical path in a high-resolution display device, which will be described in a later portion of the present specification.

Referring to FIG. 1, a partition wall 350 is positioned between the first pixel electrode (PE1) and the second pixel electrode (PE2), between the second pixel electrode (PE2) and the third pixel electrode (PE3), or between the third pixel electrode (PE3) and the first pixel electrode (PE1). A plurality of openings 355 overlapping the respective first pixel electrode (PE1), the second pixel electrode (PE2), and the third pixel electrode (PE3) may be formed in the partition wall 350.

A first emission layer 360G, a second emission layer 360B, and a third emission layer 360R may be positioned in the respective openings 355.

The first emission layer 360G may overlap the first pixel electrode (PE1), the second emission layer 360B may overlap the second pixel electrode (PE2), and the third emission layer 360R may overlap the third pixel electrode (PE3).

The first emission layer 360G may emit green light, the second emission layer 360B may emit blue light, and the third emission layer 360R may emit red light.

Referring to FIG. 1, a common electrode 270 is positioned on the partition wall 350, the first emission layer 360G, the second emission layer 360B, and the third emission layer 360R. The common electrode 270 may be a total plate.

As shown in FIG. 1, the first pixel electrode (PE1), the first emission layer 360G, and the common electrode 270 may configure a first light-emitting device (ED1). The second pixel electrode (PE2), the second emission layer 360B, and the common electrode 270 may configure a second light-emitting device (ED2), and the third pixel electrode (PE3), the third emission layer 360R, and the common electrode 270 may configure a third light-emitting device (ED3).

The display device according to the present embodiment additionally stacks the Ga-doped ITO on the pixel electrode of one of a plurality of light-emitting devices, so it is formed to be thicker than a pixel electrode of another light-emitting device. Therefore, the color purity may be improved by efficiently adjusting the optical path in the light-emitting device.

Figure 4:
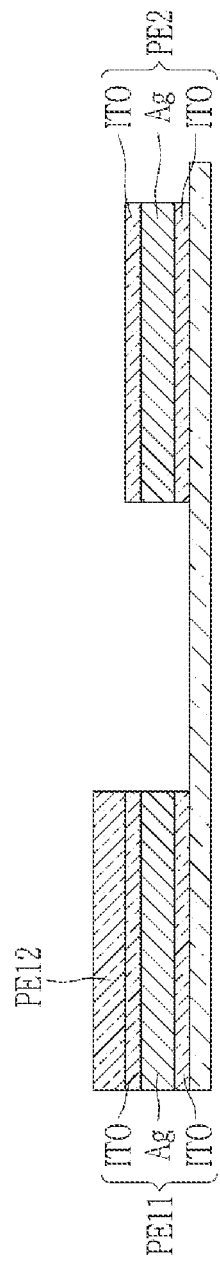
FIG. 4 shows a configuration of a first pixel electrode (PE1) and a second pixel electrode (PE2) in a display device according to the present embodiment.

FIG. 4 shows a configuration of a first pixel electrode (PE1) and a second pixel electrode (PE2) in a display device according to the present embodiment.

Referring to FIG. 4, the second pixel electrode (PE2) includes a stack of the ITO/Ag/ITO. The thickness of the ITO may be 60 to 120 Å, and the thickness of the layer of Ag may be 500 to 1000 Å.

The first pixel electrode (PE1) includes a stack of ITO/Ag/ITO in a like way of the second pixel electrode (PE2), and includes a Ga-doped ITO layer positioned thereon. For ease of description, the layer with the stack of ITO/Ag/ITO will be referred to as a first layer (PE11) and the Ga-doped layer of ITO will be referred to as a second layer (PE12) in FIG. 3.

The content of Ga may be 1 at % to 10 at % on the second layer (PE12). When the content of Ga is less than 1 at %, a Ga doping effect may not be large. Hence, the problem of crystallization may happen when it is made with more than a predetermined thickness in a like way of the conventional ITO to which no Ga is doped. When the content of Ga is greater than 10 at %, the content of Ga substantially increases, so a characteristic of the ITO may be lost.

The thickness of the second layer (PE12) may be 300 Å to 1000 Å. The above-noted range of thickness represents an optimized range for adjusting the optical path of the light-emitting device. That is, light emitted to the light-emitting device may be resonated in the light-emitting device and may be discharged to the outside. For the resonance, it is needed to adjust a length of the optical path, and for this purpose, the first pixel electrode (PE1) needs to be thick.

However, when the ITO configuring the first pixel electrode (PE1) becomes thick, a surface of the ITO may be crystallized when the ITO is etched. Therefore, the crystallized ITO is not sufficiently etched, and the etching residues are generated.

However, regarding the display device according to the present embodiment, an amorphous Ga-doped ITO is additionally deposited on the first pixel electrode (PE1). The Ga-doped ITO is amorphous, so when it becomes thick, the problem that the residues remain for the etching process may be prevented.

Figure 5:
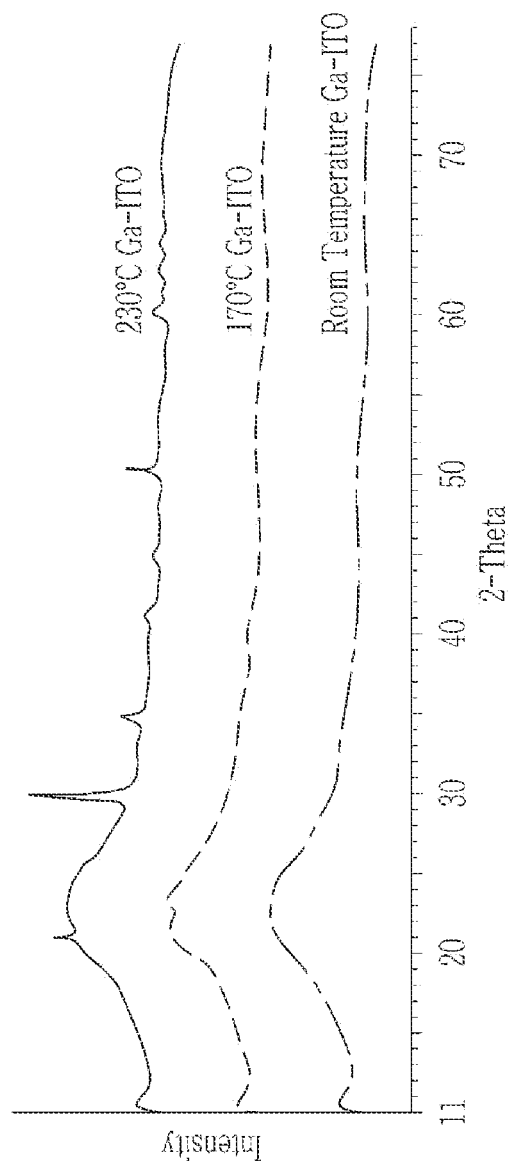
FIG. 5 shows an analysis of crystallization according to a heat treatment after a Ga-doped ITO is deposited according to the present embodiment.

FIG. 5 shows an analysis on crystallization according to a heat treatment after a Ga-doped ITO is deposited according to the present embodiment.

Referring to FIG. 5, it is found that the Ga-doped ITO according to the present embodiment does not generate crystallization when it is heat-treated up to 170° C. When heat-treated at 250° C., it is partly crystallized. Therefore, it is found that the Ga-doped ITO maintains to be amorphous when the heat-treatment temperature is not greater than 250° C.

Figure 6:
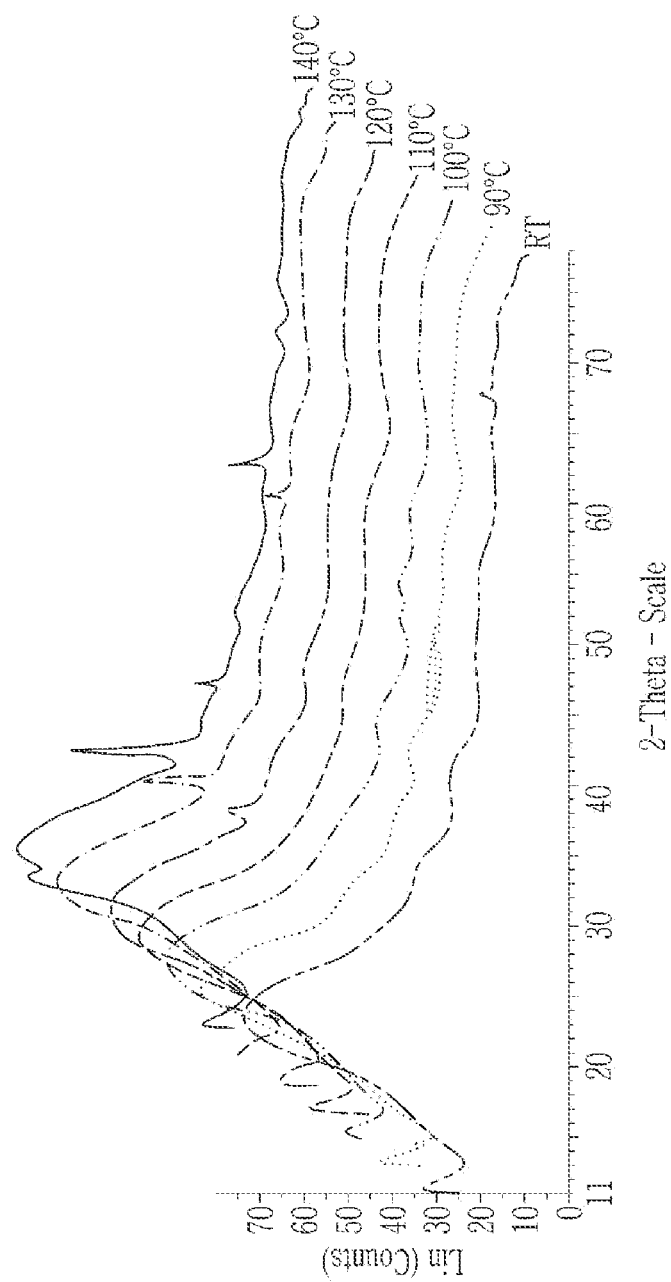
FIG. 6 shows checking of crystallization degrees according to a film forming temperature of a Ga-doped ITO.

FIG. 6 shows checking of crystallization degrees according to a film forming temperature of a Ga-doped ITO. Referring to FIG. 6, a diagram of crystallization with respect to film forming temperature is shown.

Referring to FIG. 6, it is found that the Ga-doped ITO maintained to be amorphous at the film forming temperature of up to 110° C. A maximum processing temperature in a process for wet-etching the Ga-doped ITO is equal to or less than 110° C., so it is found that the Ga-doped ITO maintains to be amorphous in the process for depositing and etching the Ga-doped ITO.

Figure 7:
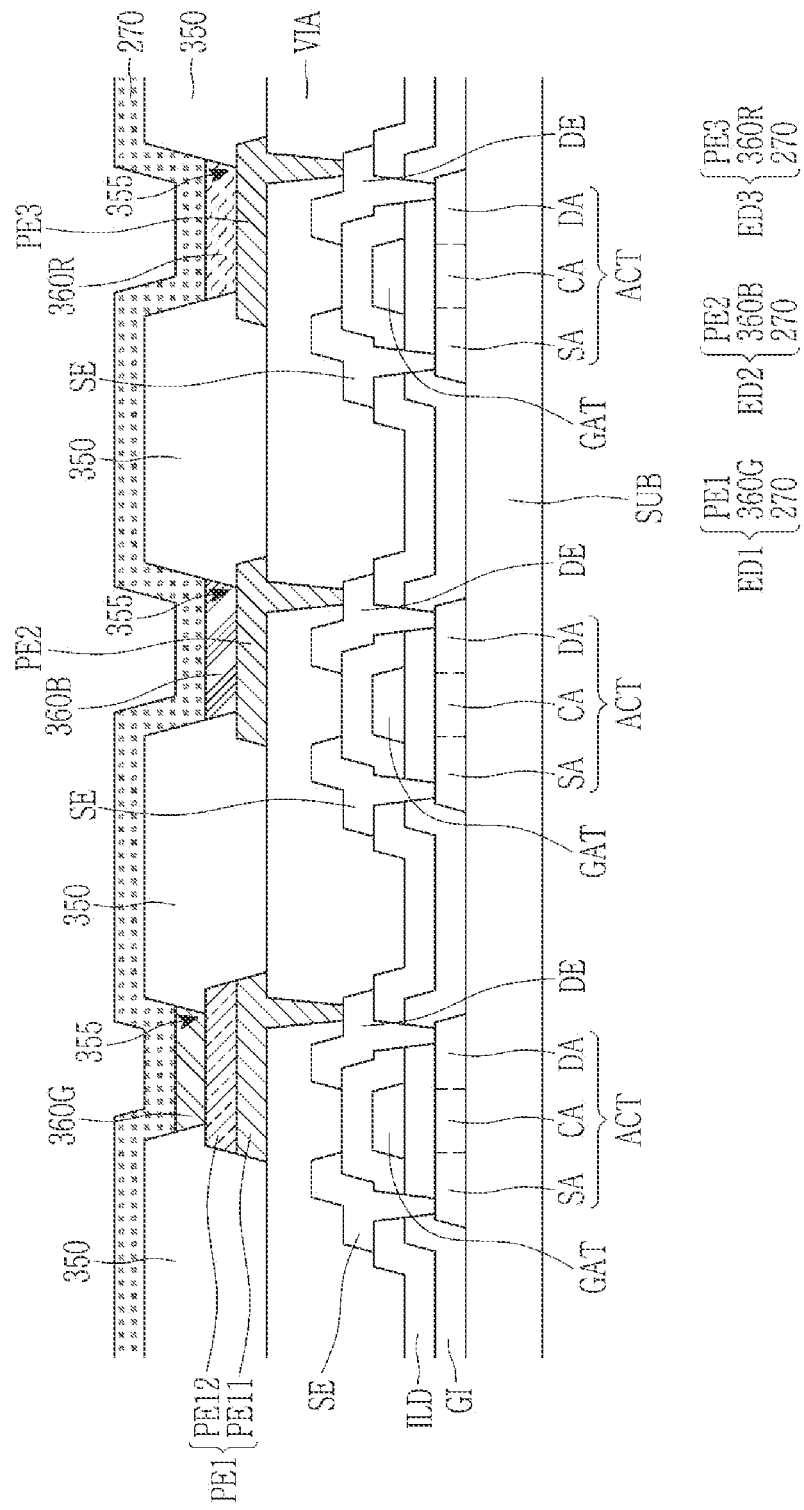
FIG. 7 shows a detailed display device according to the present embodiment.

FIG. 7 shows a detailed display device according to the present embodiment. Referring to FIG. 7, the display device includes a semiconductor layer (ACT) positioned on the substrate (SUB).

The semiconductor layer (ACT) may include one of amorphous silicon, polycrystalline silicon, and an oxide semiconductor. For example, the semiconductor layer (ACT) may include an oxide semiconductor material including low temperature polysilicon (LTPS) or at least one of zinc (Zn), indium (In), gallium (Ga), tin (Sn), and mixtures thereof. For example, the semiconductor layer may include an indium-gallium-zinc oxide (IGZO).

Although not shown, a buffer layer positioned between the semiconductor layer (ACT) and the substrate (SUB) may be further included. The buffer layer may include an inorganic insulating material such as a silicon nitride (SiNx), a silicon oxide (SiOx), or a silicon oxynitride (SiOxNy). The buffer layer may have a single- or multi-layered structure of the material.

The semiconductor layer (ACT) may include a source area (SA), a channel area (CA), and a drain area (DA).

A gate insulating layer (GI) may be positioned on the semiconductor layer (ACT). The gate insulating layer (GI) includes an inorganic insulating material such as a silicon nitride (SiNx), a silicon oxide (SiOx), or a silicon oxynitride (SiOxNy). The gate insulating layer (GI) may have a single- or multi-layered structure of the material.

The gate electrode (GAT) is positioned on the gate insulating layer (GI). The gate electrode (GAT) may include molybdenum (Mo), aluminum (Al), copper (Cu), and/or titanium (Ti), and may have a single- or multi-layered structure of the material. The gate electrode (GAT) may overlap the channel area (CA) of the semiconductor layer (ACT).

An interlayer insulating layer (ILD) may be positioned on the gate electrode (GAT). The interlayer insulating layer (ILD) may include an inorganic insulating material such as a silicon nitride (SiNx), a silicon oxide (SiOx), or a silicon oxynitride (SiOxNy).

A source electrode (SE) and a drain electrode (DE) may be positioned on the interlayer insulating layer (ILD). The source electrode (SE) and the drain electrode (DE) may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single- or multi-layered structure of the material.

The source electrode (SE) may be electrically connected to the source region (SA) of the semiconductor layer (ACT), and the drain electrode (DE) may be electrically connected to the drain region (DA) of the semiconductor layer (ACT). That is, each of the source electrode (SE) and the drain electrode (DE) is connected to the source region (SA) and the drain region (DA) respectively by a contact hole penetrating the interlayer insulating layer (ILD) and the gate insulating layer (GI).

An insulating layer (VIA) may be positioned on the source electrode (SE) and the drain electrode (DE). The insulating layer (VIA) may be an organic film. In detail, the insulating layer (VIA) may include an organic insulating material such as a general purpose polymer such as polymethyl methacrylate (PMMA) or polystyrene (PS), a polymer derivative having a phenol-based group, an acryl-based polymer, an imide-based polymer, a polyimide, and a siloxane-based polymer.

A first pixel electrode (PE1), a second pixel electrode (PE2), and a third pixel electrode (PE3) may be positioned on the insulating layer (VIA). Each of the first pixel electrode (PE1), the second pixel electrode (PE2), and the third pixel electrode (PE3) is electrically connected to the drain electrode (DE) through a contact hole positioned in the insulating layer (VIA).

Descriptions on the first pixel electrode (PE1), the second pixel electrode (PE2), and the third pixel electrode (PE3) correspond to the previously-provided descriptions. That is, the first pixel electrode (PE1) may include a first layer (PE11) and a second layer (PE12). The first layer (PE11), the second pixel electrode (PE2), and the third pixel electrode (PE3) of the first pixel electrode (PE1) may include the same material, and may include the ITO/Ag/ITO. The second layer (PE12) of the first pixel electrode (PE1) may include the Ga-doped ITO (Ga-ITO). The content of Ga in the Ga-ITO may be 1 at % to 10 at %. The thickness of the second layer (PE12) may be 300 Å to 1000 Å. The second layer (PE12) may be amorphous.

A partition wall 350 may be positioned on the first pixel electrode (PE1), the second pixel electrode (PE2), and the third pixel electrode (PE3), and the first emission layer 360G, the second emission layer 360B, and the third emission layer 360R may be positioned in the opening 355 of the partition wall 350. A common electrode 270 may be positioned on the partition wall 350, the first emission layer 360G, the second emission layer 360B, and the third emission layer 360R.

The descriptions of the partition wall 350, the first emission layer 360G, the second emission layer 360B, the third emission layer 360R, and the common electrode 270 correspond to what are described with reference to FIG. 1. No detailed descriptions on the same constituent elements will be provided.

Numerous varied embodiments of the present disclosure will now be described with reference to drawings.

FIGS. 8, 9, 10, 11, 12, and 13 show the same cross-section as FIG. 1 for various embodiments.

Figure 8:
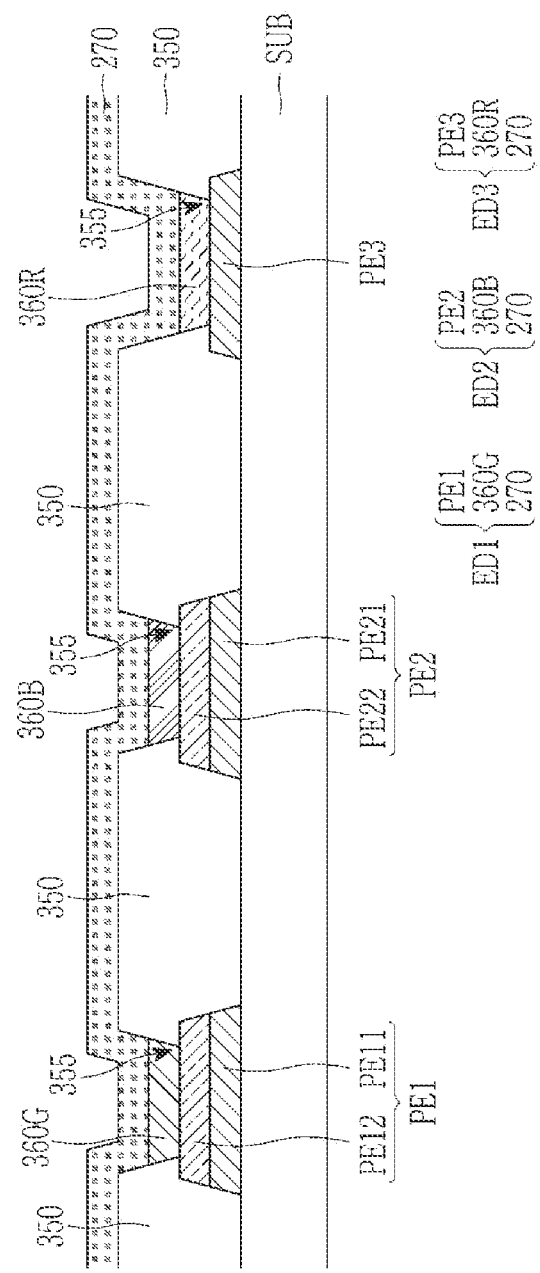
FIGS. 8, 9, 10, 11, 12, and 13 show the same cross-section as FIG. 1 for various embodiments.

Referring to FIG. 8, the display device according to the present embodiment corresponds to what is described with reference to FIG. 1, except that the second pixel electrode (PE2) and the first pixel electrode (PE1) include a Ga-doped ITO layer. No same constituent elements will be described.

That is, regarding the display device according to the present embodiment, the second pixel electrode (PE2) includes a first layer (PE21) including an ITO/Ag/ITO and a second layer (PE22) including a Ga-doped ITO. The second layer (PE22) of the second pixel electrode (PE2) may be made by the same process as the second layer (PE12) of the first pixel electrode (PE1). That is, the second layer (PE22) of the second pixel electrode (PE2) and the second layer (PE12) of the first pixel electrode (PE1) may include the same material and may have the same thickness. The second layer (PE22) of the second pixel electrode (PE2) may include the Ga-doped ITO (Ga-ITO). The content of Ga in the Ga-doped ITO may be 1 at % to 10 at %. The thickness of the second layer (PE22) may be 300 Å to 1000 Å. The second layer (PE22) may be amorphous.

When each of the first pixel electrode (PE1) and the second pixel electrode (PE2) includes a Ga-doped ITO layer, the optical path may be adjusted on the pixel including each of the pixel electrodes.

Figure 9:
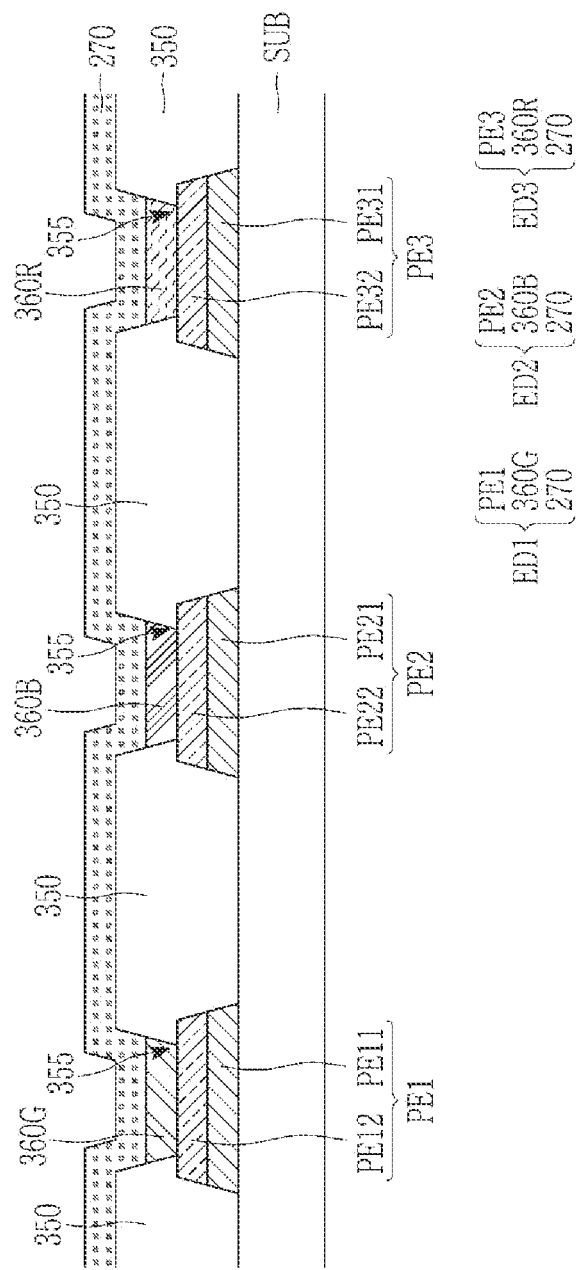

FIG. 9 shows the same cross-section as FIG. 8 according to another embodiment. Referring to FIG. 9, the display device according to the present embodiment corresponds to what are described with reference to FIG. 8 except that the third pixel electrode (PE3) as well as the first pixel electrode (PE1) and the second pixel electrode (PE2) includes a Ga-doped ITO layer. No same constituent elements will be described in detail.

That is, regarding the display device according to the present embodiment, the third pixel electrode (PE3) includes a first layer (PE31) including an ITO/Ag/ITO and a second layer (PE32) including a Ga-doped ITO. The second layer (PE32) of the third pixel electrode (PE3) may be made by the same process as the second layer (PE12) of the first pixel electrode (PE1) and the second layer (PE22) of the second pixel electrode (PE2). That is, the second layer (PE32) of the third pixel electrode (PE3), the second layer (PE12) of the first pixel electrode (PE1), and the second layer (PE22) of the second pixel electrode (PE2) may have the same material and may have the same thickness. The second layer (PE32) of the third pixel electrode (PE3) may include the Ga-doped ITO (Ga-ITO). The content of Ga of the Ga-doped ITO may be 1 at % to 10 at %. The thickness of the second layer (PE32) may be 300 Å to 1000 Å. The second layer (PE32) may be amorphous.

When each of the first pixel electrode (PE1), the second pixel electrode (PE2), and the third pixel electrode (PE3) includes a Ga-doped ITO layer, the optical path may be adjusted on the pixel including each of the pixel electrodes.

Figure 10:
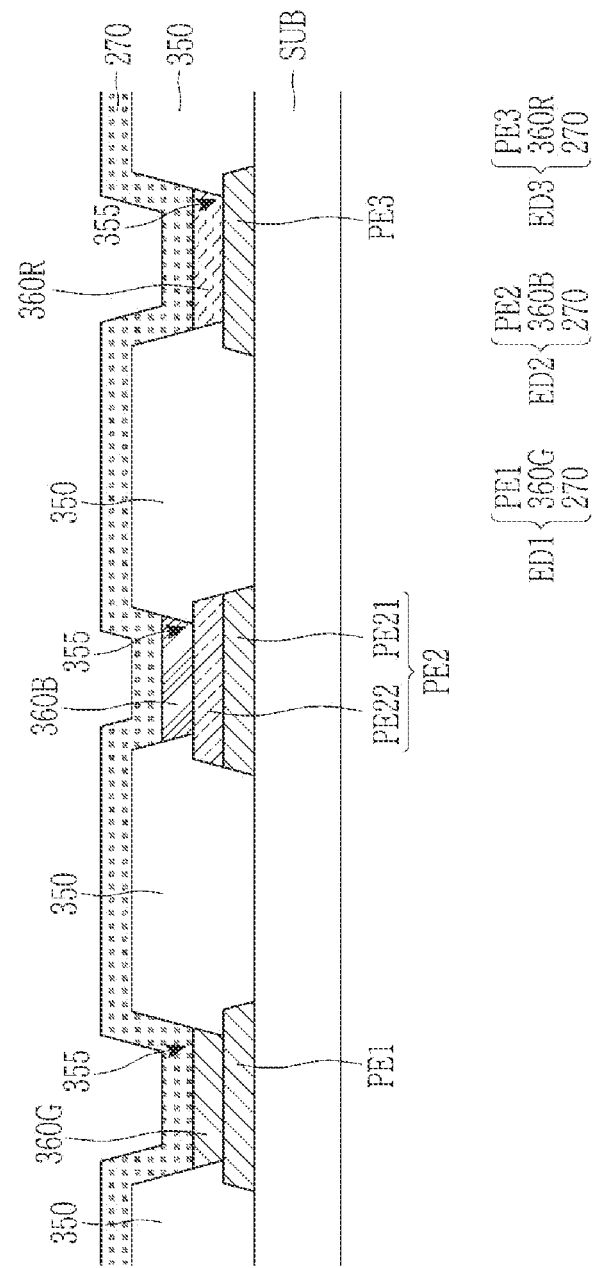

FIG. 10 shows the same cross-section as FIG. 1 according to another embodiment. Referring to FIG. 10, the display device according to the present embodiment corresponds to the embodiment described with reference to FIG. 1, except that the second pixel electrode (PE2) instead of the first pixel electrode (PE1) includes the second layer (PE22) having a Ga-doped ITO (Ga-ITO). No same constituent elements will be described in detail.

Figure 11:
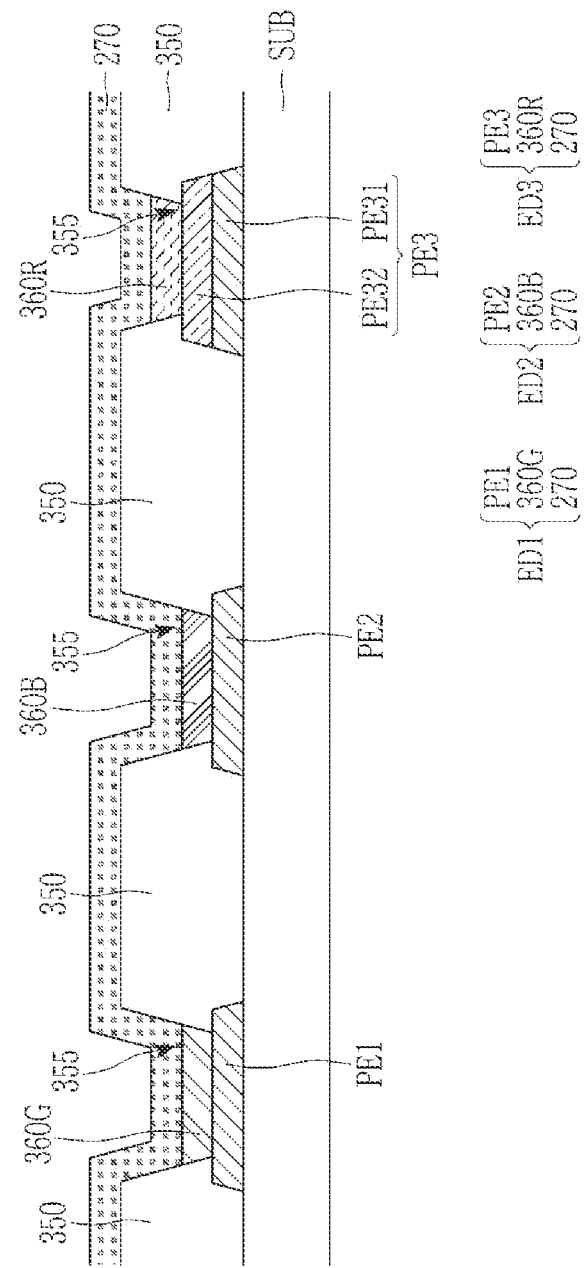

FIG. 11 shows a same cross-section as FIG. 1 according to another embodiment. Referring to FIG. 11, the display device according to the present embodiment corresponds to the embodiment described with reference to FIG. 1, except that the third pixel electrode (PE3) instead of the first pixel electrode (PE1) includes the second layer (PE32) including a Ga-doped ITO (Ga-ITO). No same constituent elements will be described in detail.

Figure 12:
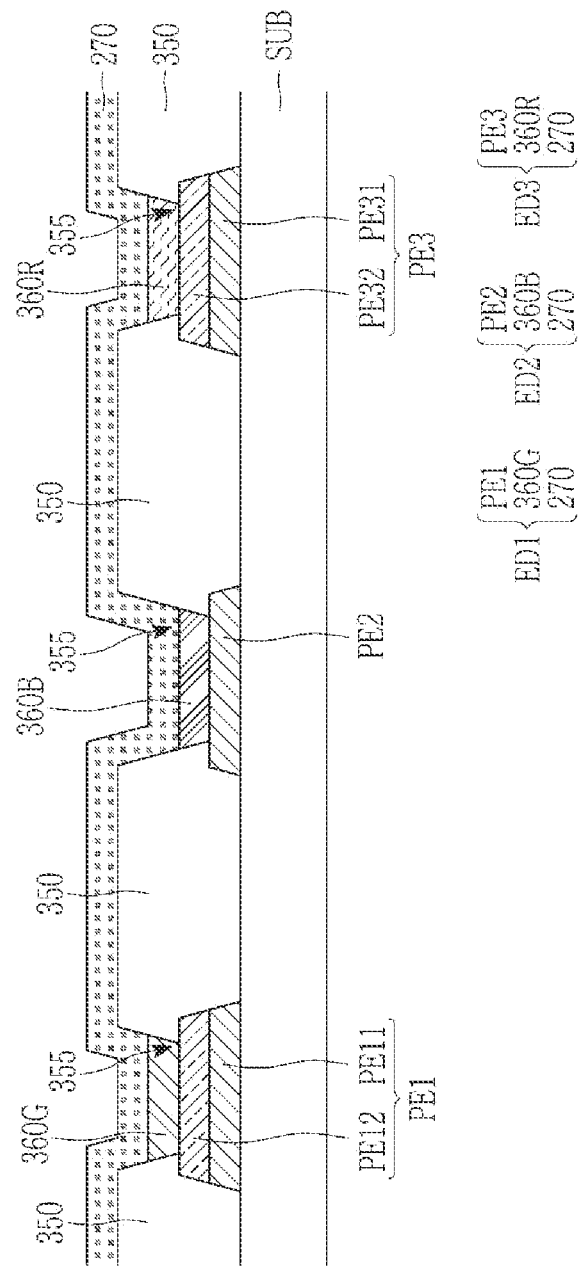

FIG. 12 shows the same cross-section as FIG. 1 according to another embodiment. Referring to FIG. 12, the display device according to the present embodiment corresponds to the embodiment described with reference to FIG. 1, except that the first pixel electrode (PE1) includes the second layer (PE12) having a Ga-doped ITO (Ga-ITO) and the third pixel electrode (PE3) includes the second layer (PE32) having a Ga-doped ITO (Ga-ITO). No same constituent elements will be described in detail.

Figure 13:
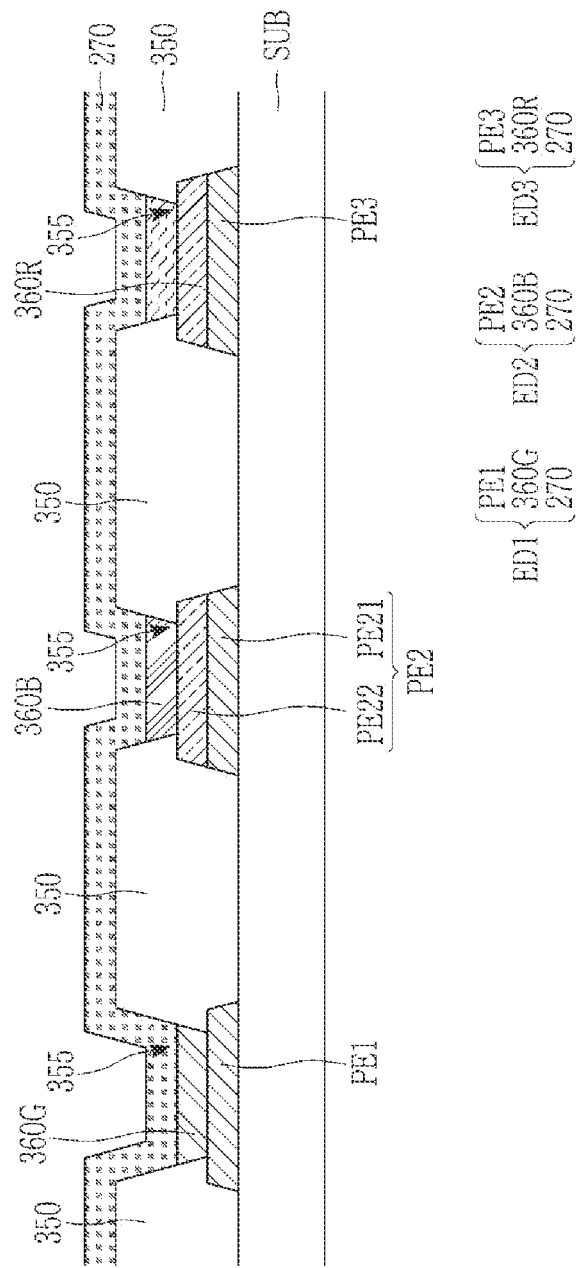

FIG. 13 shows the same cross-section as FIG. 1 according to another embodiment. Referring to FIG. 13, the display device according to the present embodiment corresponds to the embodiment described with reference to FIG. 1, except that the second pixel electrode (PE2) includes the second layer (PE22) having a Ga-doped ITO (Ga-ITO) and the third pixel electrode (PE3) includes the second layer (PE32) having a Ga-doped ITO (Ga-ITO). No same constituent elements will be described in detail.

A method for manufacturing a display device according to the present embodiment will now be described, focusing on a process for forming a pixel electrode, with reference to FIGS. 14, 15, 16, 17, and 18. FIGS. 14, 15, 16, 17, and 18 shows cross-sectional views of a process for forming a pixel electrode according to the present embodiment.

Figure 14:
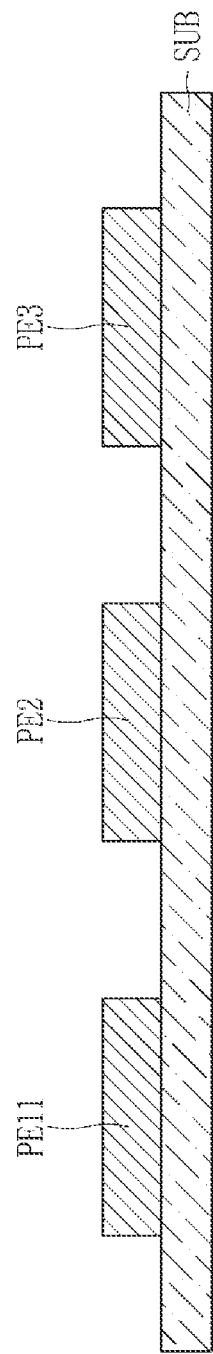
FIGS. 14, 15, 16, 17, and 18 show process cross-sectional views of a process for forming a pixel electrode according to the present embodiment.

Referring to FIG. 14, a layer including an ITO/Ag/ITO is deposited and patterned on the substrate (SUB). Each of the patterned portions becomes the first layer (PE11) of the first pixel electrode (PE1), the second pixel electrode (PE2), and the third pixel electrode (PE3).

The patterned ITO/Ag/ITO layer may be heat-treated to crystallize the ITO. This is to prevent the formed layer of ITO/Ag/ITO from being etched in a subsequent process for depositing and etching the Ga-ITO. When the ITO is crystallized by the heat treatment, it is not sufficiently etched in the next stage. Therefore, the layer of ITO/Ag/ITO may not be etched in the process for etching the Ga-ITO.

Figure 15:
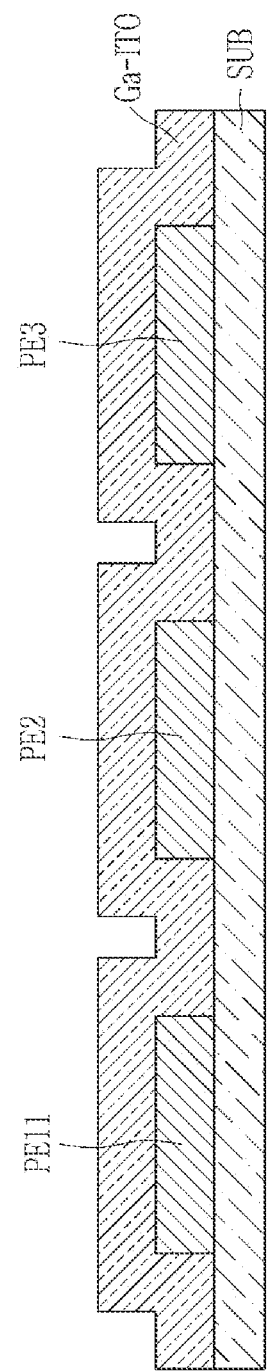

Referring to FIG. 15, a Ga-doped ITO (Ga-ITO) is deposited on the first layer (PE11) of the first pixel electrode (PE1), the second pixel electrode (PE2), and the third pixel electrode (PE3). As shown in FIG. 15, the Ga-doped ITO is applied on the substrate (SUB). The Ga-doped ITO may be formed on the entire side thereof to cover the first layer (PE11) of the first pixel electrode (PE1), the second pixel electrode (PE2), and the third pixel electrode (PE3).

The thickness of the Ga-doped ITO (Ga-ITO) may be 300 Å to 1000 Å. The content of Ga of the Ga-ITO may be 1 at % to 10 at %.

Figure 16:
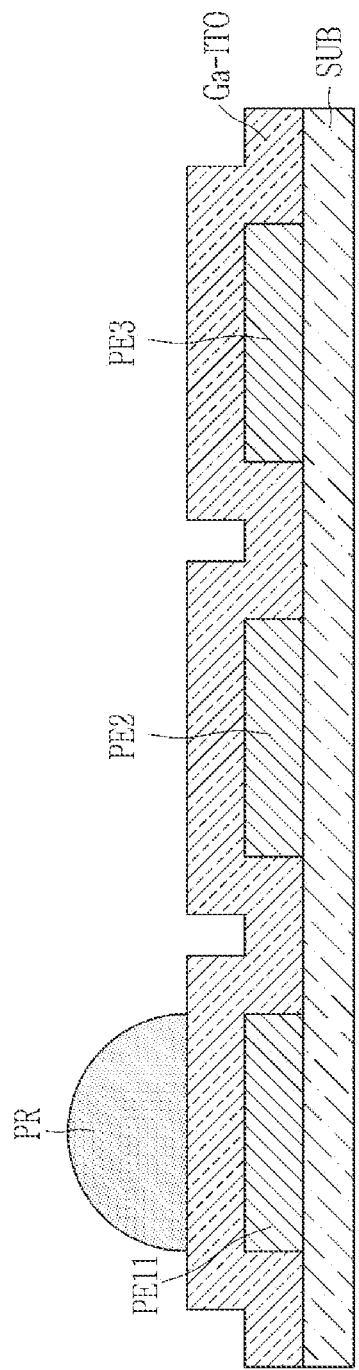

Referring to FIG. 16, a PR is positioned on the layer of Ga-doped ITO (Ga-ITO). As shown in FIG. 16, the PR may overlap the first layer (PE11) of the first pixel electrode.

Figure 17:
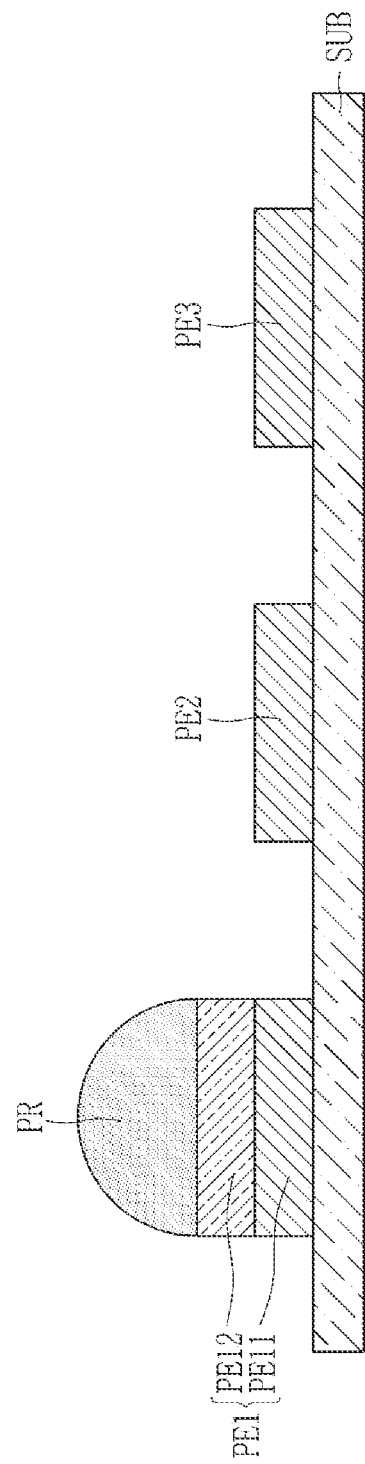

Referring to FIG. 17, the layer of Ga-ITO that is not covered by the PR is etched. Here, it may be wet-etched by using an Ag damage free a-ITO etchant. In the above, the layer of ITO/Ag/ITO is crystallized by the crystallization process, so it is not etched by the a-ITO etchant.

As shown in FIG. 17, the Ga-ITO layer overlapping the PR is not etched and may configure the second layer (PE12) of the first pixel electrode.

Figure 18:
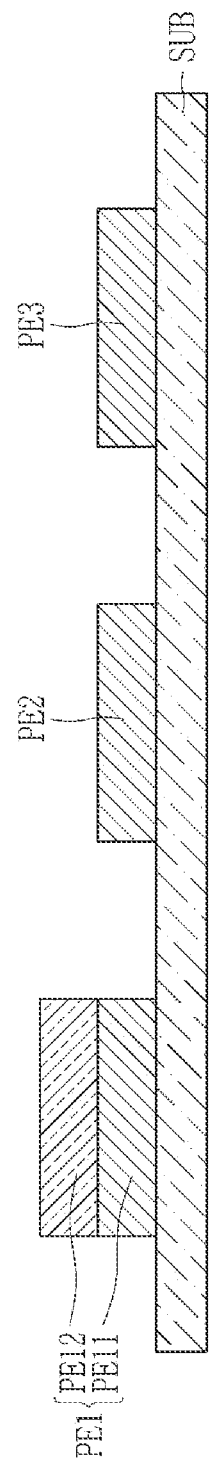

Referring to FIG. 18, the PR is eliminated. The first pixel electrode (PE1) including the first layer (PE11) and the second layer (PE12), the second pixel electrode (PE2) including the same layer as the first layer of the first pixel electrode (PE1), and the third pixel electrode (PE3) including the same layer as the first layer of the first pixel electrode (PE1) are formed.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a substrate;
a plurality of transistors disposed on the substrate;
a first pixel electrode, a second pixel electrode, and a third pixel electrode, each of the pixel electrodes connected to each of the transistors;
a first emission layer disposed to overlap the first pixel electrode, a second emission layer disposed to overlap the second pixel electrode, and a third emission layer disposed to overlap the third pixel electrode; and
a common electrode disposed on the first emission layer, the second emission layer, and the third emission layer,
wherein the first pixel electrode includes a first layer and a second layer disposed on the first layer, and the second layer includes a Ga-doped ITO.

2. The display device of claim 1, wherein
a content of Ga of the second layer is 1 at % to 10 at %.

3. The display device of claim 1, wherein
a thickness of the second layer is 300 Å to 1000 Å.

4. The display device of claim 1, wherein
the second layer is amorphous.

5. The display device of claim 1, wherein
each of the first layer of the first pixel electrode, the second pixel electrode, and the third pixel electrode includes a same material.

6. The display device of claim 1, wherein
a thickness of the first pixel electrode including the first layer and second layers is greater than thicknesses of the second pixel electrode and the third pixel electrode, and
each of the first layer of the first pixel electrode, the second pixel electrode, and the third pixel electrode have a same thickness.

7. The display device of claim 1, wherein
the first layer is a sequential stack of layers of ITO/Ag/ITO.

8. The display device of claim 7, wherein
an upper side of the ITO of the first layer is crystalline.

9. The display device of claim 1, wherein
the second pixel electrode includes a first layer and a second layer disposed on the first layer, and
the second layer includes a Ga-doped ITO.

10. The display device of claim 9, wherein
a content of Ga in the second layer of the second pixel electrode is 1 at % to 10 at %.

11. The display device of claim 9, wherein
a thickness of the second layer of the second pixel electrode is 300 Å to 1000 Å.

12. The display device of claim 9, wherein
the third pixel electrode includes a first layer and a second layer disposed on the first layer, and
the second layer includes a Ga-doped ITO.

13. The display device of claim 12, wherein
a content of Ga in the second layer of the third pixel electrode is 1 at % to 10 at %.

14. The display device of claim 12, wherein
a thickness of the second layer of the third pixel electrode is 300 Å to 1000 Å.

15. The display device of claim 1, wherein
the first emission layer emits green light,
the second emission layer emits blue light, and
the third emission layer emits red light.

16. A method for manufacturing a display device comprising steps of:
providing a substrate;
forming a first conductive layer on the substrate and patterning the first conductive layer to form a first layer of a first pixel electrode, a second pixel electrode, and a third pixel electrode;
heat-treating the patterned first conductive layer to crystallize;
forming a second conductive layer on the first conductive layer; and
patterning the second conductive layer to form a second layer disposed on the first layer of the first pixel electrode,
wherein the second conductive layer includes a Ga-doped ITO.

17. The method of claim 16, wherein
a content of Ga of the second layer of the first pixel electrode is 1 at % to 10 at %.

18. The method of claim 16, wherein
a thickness of the second layer of the first pixel electrode is 300 Å to 1000 Å.

19. The method of claim 16, wherein
the second conductive layer is amorphous.

20. The method of claim 16, wherein
the first conductive layer is a sequential stack of layers of ITO/Ag/ITO.

* * * * *